United States Patent [19]  [11] Patent Number: 4,981,551
Palmour  [45] Date of Patent: Jan. 1, 1991

[54] DRY ETCHING OF SILICON CARBIDE

[75] Inventor: John W. Palmour, Raleigh, N.C.

[73] Assignee: North Carolina State University, Raleigh, N.C.

[21] Appl. No.: 403,672

[22] Filed: Sep. 6, 1989

Related U.S. Application Data

[63] Continuation of Ser. No. 116,467, Nov. 3, 1987, Pat. No. 4,865,685.

[51] Int. Cl.$^5$ .................. B44C 1/22; C03C 15/00; C23F 1/02; H01L 21/306
[52] U.S. Cl. .................................. 156/643; 156/646; 156/657; 156/659.1; 156/662; 204/192.37; 252/79.1; 437/228; 437/234
[58] Field of Search .......... 156/643, 646, 657, 659.1, 156/662; 204/192.32, 192.37; 427/38, 39; 252/79.1; 437/228, 234

[56] References Cited

U.S. PATENT DOCUMENTS

| 3,398,033 | 8/1968 | Haga et al. | 156/662 |
| 3,421,956 | 1/1969 | Ebert et al. | 252/79.1 X |
| 4,226,665 | 10/1980 | Mogab | 156/643 |
| 4,595,453 | 6/1986 | Yamazaki et al. | 156/643 |
| 4,735,920 | 4/1988 | Stephani et al. | 437/234 |
| 4,865,685 | 9/1989 | Palmour | 156/643 |

OTHER PUBLICATIONS

R. W. Brander and A. L. Boughey; The Etching of α-Silicon Carbide; Brit. J. Appl. Phys., 1967, vol. 18, printed in Great Britain.
E. Biedermann; Selectively Etching Semiconductor Material; IBM Tech. Discl. Bulletin; vol. 9, No. 2, Jul. 1966.
J. W. Palmour, B. E. Williams, P. Astell-Burt and R. F. Davis; Crystallographic Etching Phenomenon During Plasma Etching of SiC (100) Thin Films in SF$_6$ J. Electrochem. Soc., vol. 136, No. 2, Feb. 1989.
G. Kelner, S. C. Binari and P. H. Klein; Plasma Etching of β-SiC; Metal-Oxide-Semiconductor Structures; vol. 134, No. 1.
J. W. Palmour, R. F. David, T. M. Wallett and K. B. Bhasin; Dry Etching of β-SiC in CF$_4$ and CF$_4$+O$_2$ Mixtures; J. Vac. Sci. Technol. A 4(3), May/Jun. 1986.
J. A. Edmond, J. W. Palmour and R. F. Davis; Chemical Etching of Ion Implanted Amorphous Silicon Carbides; J. Electrochem. Soc.: Solid-State Science and Technology; Mar. 1986.
J. Sugiura, W.-J. Lu, K. C. Cadien and A. J. Steckl; Reactive Ion Etching of SiC Thin Films Using Fluorinated Gases; J. Vac. Sci. Technol.B 4(1), Jan./Feb. 1986.
S. Dohmae, K. Shibahara, S. Nishino and H. Matsunami; Plasma Etching of CVD Grown Cubic SiC Single Crystals; Japanese Journal of Applied Physics, vol. 24, No. 11, Nov. 1985, pp. L873-L875.
S. Matsui, S. Mizuki, T. Yamato, H. Aritome and S. Namba; Reactive Ion-Beam Etching of Silicon Carbide; Japanese Journal of Applied Physics, vol. 20, No. 1, Jan. 1981, pp. L38-L40.

Primary Examiner—William A. Powell
Attorney, Agent, or Firm—Bell, Seltzer, Park & Gibson

[57] ABSTRACT

The invention comprises a method of etching a silicon carbide target. In one embodiment, a reactive ion plasma is formed from a gas which is easily dissociated into its elemental species in the plasma, for which all of the dissociated elemental species are volatile in the plasma, and for which at least one of the elemental species is reactive with silicon carbide. The silicon carbide target to be etched is positioned on one of the electrodes which is formed from a material with a low sputter yield and which material reacts with a dissociated species to thereby prevent contamination of the target with either sputtered materials from the electrode or polymerized species from the plasma.

34 Claims, 9 Drawing Sheets

DRY ETCHING OF SILICON CARBIDE

FIELD OF THE INVENTION

The present invention generally relates to dry etching methods for making electronic devices such as semiconductor devices or the like, and especially to a dry etching technique for etching silicon carbide (SiC). This application is a continuation in part of Ser. No. 07/116,467, filed Nov. 3, 1987, Now U.S. Pat. No. 4,865,685.

BACKGROUND OF THE INVENTION

In the manufacture of electronic devices from semiconductor materials, one technique of interest is the selective building up, followed by the selective removal, of various layers of different materials, so that the building up and removal processes result in specific electronic devices such as transistors, diodes, capacitors and the like.

One technique for removing layers of semiconductor or other materials from a given substrate is known as etching, which is the removal of a material following its interaction with another material generally referred to as the etchant. Etching techniques fall into two broad categories: wet etching which generally refers to techniques which take place in solutions or molten salts or other liquid materials; and dry etching which generally refers to the use of gases or plasmas to perform the removal which is desired.

Dry etching techniques are of particular interest in producing electronic devices because they generally exhibit better resolution and improved dimensional and shape control capabilities than do the various methods of wet etching. Accordingly, dry etching is favorably utilized where superior pattern control and delineation is required such as the processing of semiconductor wafers to form large scale integrated devices and integrated circuits.

Dry etching techniques can be used to micromachine mesas, isolation trenches, backside contact via holes, and other forms of pattern definition on thin films, substrates, or other materials.

One perennial candidate material for use in semiconductor devices—and which correspondingly requires etching in order to form certain of these devices—is silicon carbide (SiC). Silicon carbide has long been recognized as having certain favorable characteristics as a semiconductor material, including its wide bandgap, high thermal conductivity, high saturated electron drift velocity, and high electron mobility. To date, however, silicon carbide has not reached the commercial position in the manufacture of electronic devices that would be expected on the basis of its excellent semiconductor properties. This is a result of the difficulties encountered in working with silicon carbide: high process temperatures are often required, good starting materials can be difficult to obtain, certain doping techniques have heretofore been difficult to accomplish, and perhaps most importantly, silicon carbide crystallizes in over 150 polytypes, many of which are separated by very small thermodynamic differences. Accordingly, controlling the growth of single crystals or monocrystalline thin films of silicon carbide which are of a sufficient quality to make electronic devices practical and useful, has eluded researchers.

Recently, however, a number of developments have been accomplished which offer the ability to grow large single crystals of device quality silicon carbide, thin films of device quality silicon carbide, and to introduce dopants into silicon carbide, as required in the manufacture of many electronic devices. These include successful chemical vapor deposition (CVD) of both Beta-SiC and Alpha-SiC high quality thin films (epitaxial layers) on "off-axis" SiC substrates; improved sublimation growth techniques; and improved doping techniques, particularly ion implantation.

With the successes offered by these developments, an appropriate technique for etching silicon carbide is likewise desirable, for example in the production of mesa=type structures or any other structures in which etching is required.

A number of investigators have attempted to develop methods for etching silicon carbide under circumstances in which silicon carbide is used as a mask for a patterning process rather than as the active semiconductor portion of an electronic device. An early U.S. Pat. No. 3,398,033, to Haga discusses a method of etching silicon carbide using a mixture of oxygen and chlorine heated to between 1200° and 1300° C. Accordingly to Haga, this process partially deteriorates the silicon carbide, after which the remainder can be removed by a wet reaction in a mixture of hydrofluoric and nitric acids.

Yonezawa, U.S. Pat. No. 4,351,894, also discusses the use of silicon carbide as a mask material in manufacturing electronic devices from other semiconductor materials. According to Yonezawa, removal of silicon carbide is accomplished by either a plasma etching process using carbon tetrafluoride and oxygen, or by an electrolytic etching technique in which an electrolyte is selected from a mixture or perchloric acid, acetic acid and water; or from formic acid; or a mixture of sulfuric acid and water.

In a later patent, U.S. Pat. No. 4,560,642, Yonezawa discusses a slightly different technique for using silicon carbide as a mask material, but describes identical etching processes for removing the silicon carbide mask.

Yamazaki, U.S. Pat. No. 4,595,453, discusses a method of forming a semiconductor substrate, rather than a mask, which may be formed of silicon carbide. Yamazaki suggests using hydrogen fluoride gas (HF) as the reactive gas plasma for selectively or nonselectively etching the semiconductor silicon carbide substrate.

In the scientific literature, Lu et al., *Thermal Oxidation of Sputtered Silicon Carbide Thin Films*, J. Electrochem. Soc., 131, 1907 (1984), discuss masking techniques using amorphous silicon carbide films and using mixtures of tetrafluoramethane ($CF_4$) and oxygen, as well as nitrogen trifluoride ($NF_3$) as mask-removing reactive ion etching plasmas. The thin films described by Lu, however, are sputter deposited films of silicon carbide, a technique which results in either amorphous layers or partially polycrystalline layers which for practical purposes are amorphous. As is known to those familiar with semiconductor materials and their properties, such amorphous or polycrystalline materials are essentially useless for forming the active portion of semiconductor devices. Furthermore, Lu offers only a general discussion of the etching he reports carrying out.

A number of other researchers have studied potential techniques for etching silicon carbide and a selection of appropriate references has been cited herewith in the accompanying information disclosure statement.

By way of background, reactive ion etching is a procedure in which the material to be etched, sometimes called the target, is placed on a cathode in an electric field, and in the presence of a selected vaporized material. A potential is applied across the anode and cathode which is sufficient to ionize atoms and molecules in the vapor, as well as to produce some radicals. The potential difference accelerates positively charged ions in the vapor towards the target on the cathode. As these ions strike the material, they physically etch it away. In reactive ion etching, the vaporized material is selected to chemically react with the target material, thus enhancing the effects of the physical collisions.

In producing devices using such dry etching techniques, certain problems occur which must be addressed before successful results can be obtained. For example, when a gas like tetrafluoromethane ($CF_4$) is used as the reactant gas, polymerization tends to occur among the fluorocarbon radicals formed, which in turn cause fluorocarbon compounds to deposit onto the surface being etched. These impurities, however, are undesirable whenever the etched surface is to be used for silicon carbide-based electronic devices. Because high quality ohmic contacts must eventually be made on the etched surface in order to produce workable devices, a smooth, chemically clean etch is imperative.

Accordingly, it is an object of the present invention to provide a method of dry etching monocrystalline silicon carbide which produces a smooth and chemically clean etched surface using plasma etching, reactive ion etching, or reactive ion beam etching processes; which method produces faster etch rates than have been possible to date for the dry etching of silicon carbide; and in which the etchant is efficiently broken into free radicals and for which all of the by-products of ionization are volatile; and using electrode materials which exhibit low sputter yield and which will react with the by-products of ionization so that they will not affect the etched surface.

The foregoing objects and advantages and other features of the invention will be set forth in the accompanying detailed description, in which preferred and exemplary embodiments are set forth, taken in conjunction with the accompanying drawings in which:

SUMMARY OF THE INVENTION

The invention comprises a method of etching monocrystalline thin films and single crystals of silicon carbide using nitrogen trifluoride ($NF_3$). Following etching, the etched surfaces were characterized by Auger electron spectroscopy (AES) and scanning electron microscopy (SEM). By using carbon or quartz cathodes, a very smooth and much cleaner surface resulted than was obtained using other cathodes. In comparison to other techniques, the optimal conditions for etching silicon carbide are using $NF_3$ and a carbon or quartz cathode.

DETAILED DESCRIPTION OF THE PREFERRED EMBODIMENTS

The present invention comprises a method of dry etching of silicon carbide using $NF_3$ as the etchant. In this technique, the $NF_3$ gas is dissociated in a plasma and the dissociated species (radicals) etch the silicon carbide which is immersed in the plasma. As is known to those familiar with plasma physics, there is a synergistic effect between the radicals and the ions in the plasma that allow very inert materials to be etched. The radicals and ions that result from the plasma can be introduced to the silicon carbide in one of three different ways; plasma etching, reactive ion etching, and reactive ion beam etching. In plasma etching, no direct current bias is applied other than the field required to generate the plasma. In reactive ion etching (RIE), a direct current bias is applied to the system in addition to the plasma-generating field and induces directional ion bombardment. Where desired, a magnet can be positioned behind the target to enhance the RIE process, a technique known as magnetron etching. In reactive ion beam etching, the ions are directed from a source chamber to a negatively biased silicon carbide target, which is also often maintained in a higher vacuum (lesser pressure) target chamber. The $NF_3$ can be ionized in either a radio frequency (rf), microwave, direct current (DC) or electron cyclotron resonance (ECR) plasma, depending upon the desired process.

Silicon carbide is chemically very inert and can only be conventionally etched by molten salts, or by chlorine or hydrogen gases at high temperatures. The dry etching techniques of the present invention offer a more controllable low-temperature method of etching silicon carbide. As further stated above, however, previous attempts have shown that dry-etching silicon carbide using more conventional gases such as $CF_4$ leaves a graphitic surface contaminated with materials such as fluorocarbon polymers. These surface conditions are undesirable where the etched surface is being prepared for making ohmic contacts for an electronic device.

Therefore, a desirable gas for etching silicon carbide should be readily dissociable into etching radicals and not into non-etching radicals, ions or molecules which merely contaminate the target. Nitrogen trifluoride is one such desirable gas because it can be efficiently broken into nitrogen and free fluorine radicals, and because all of the possible by-products of the ionization process are volatile. As a result, surfaces etched with NF$_3$ tend to be very clean. Where desired, the NF$_3$ can be mixed with other gases, particularly oxygen (O$_2$) nitrous oxide (N$_2$O), or another oxygen-containing composition that is otherwise dissociable into species that remain volatile in the plasma. Where desired, diluent gases such as argon (Ar) or helium (He) may also be included.

In particular embodiments of the present invention, thin films of beta silicon carbide which had been epitaxially grown on silicon (100) substrates were etched. As indicated earlier, however, it is now possible to successfully grow device quality silicon carbide thin films upon silicon carbide substrates and the etching techniques of the present invention are equally applicable under these circumstances.

Following the growth of the beta silicon carbide thin films, the samples were polished with diamond paste, oxidized, etched in hydrofluoric acid, and rinsed in deionized water. The samples that were analyzed using scanning electron microscopy (SEM) were masked with evaporated aluminum that was patterned using standard photolithographic techniques. The samples used for Auger electron spectroscopy (AES) were left unmasked.

In a particular embodiment of the invention, the reactive ion etching techniques were performed in a parallel plate reactor with a 28.0 cm diameter aluminum anode, a 17.0 cm diameter anodized aluminum cathode, and a plate separation of 5.0 cm. The samples were placed directly on the anodized aluminum cathode or, as discussed more fully herein, on a carbon cover plate over the anode. The samples were kept at a temperature of 308 K. A 13.56 megahertz (MHz) rf supply powered the cathode at densities of 0.440 to 0.548 watts per square centimeter (W/cm$^2$). The chamber was evacuated to a pressure of $5 \times 10^{-5}$ Torr and the NF$_3$ was introduced at 25 standard cubic centimeters per minute (sccm) while the pressure was maintained at 40 millitorr ($4 \times 10^{-2}$ torr). In general, flow rates of from about 1 to about 500 sccm are appropriate with about 20 to about 60 sccm preferred. It should be understood that nitrogen trifluoride gas is an extremely toxic material and must be handled carefully and under the proper precautions in carrying out the techniques of the present invention.

As is known to those familiar with plasma science, a plasma can be formed under a number of gas pressure and electric power conditions. For example, natural lightening is a plasma effect which takes place at atmospheric pressure under the application of enormous amounts of electric power. For scientific and commercial purposes, however, normally available power supplies make plasma formation much more feasible at lower gas pressures. At moderate power supply levels (typically between about 10 and about 400 watts to the powered electrode) a gas pressure of between about 5 and about 200 milliTorr (mTorr, i.e. between about $5 \times 10^{-3}$ and $60 \times 10^{-3}$ Torr) are appropriately used, although in some cases, pressures high as 10 Torr are still appropriate. In a preferred embodiment, a total pressure of about 100 mTorr and a mixture of 5% nitrous oxide (N$_2$O) in NF$_3$ has been found to be satisfactory. Using typical equipment, this results in power densities of between about 0.04 and about 2 watts per square centimeter (W/cm$^2$), with densities of between about 0.4 and about 0.9 W/cm$^2$ preferred. At generally lower pressures, the amount of gas present is insufficient to support the number of collisions required to maintain the plasma. At generally higher pressures, so much gas is present that the increased number of collisions tend to first dampen, and then quench, the plasma. It should be understood, therefore, that the selection of temperatures, power levels, and gas pressures used in practicing the present invention can vary widely and that those specified herein are given by way of example, and not as limitation on the scope of the invention.

Figure 1:
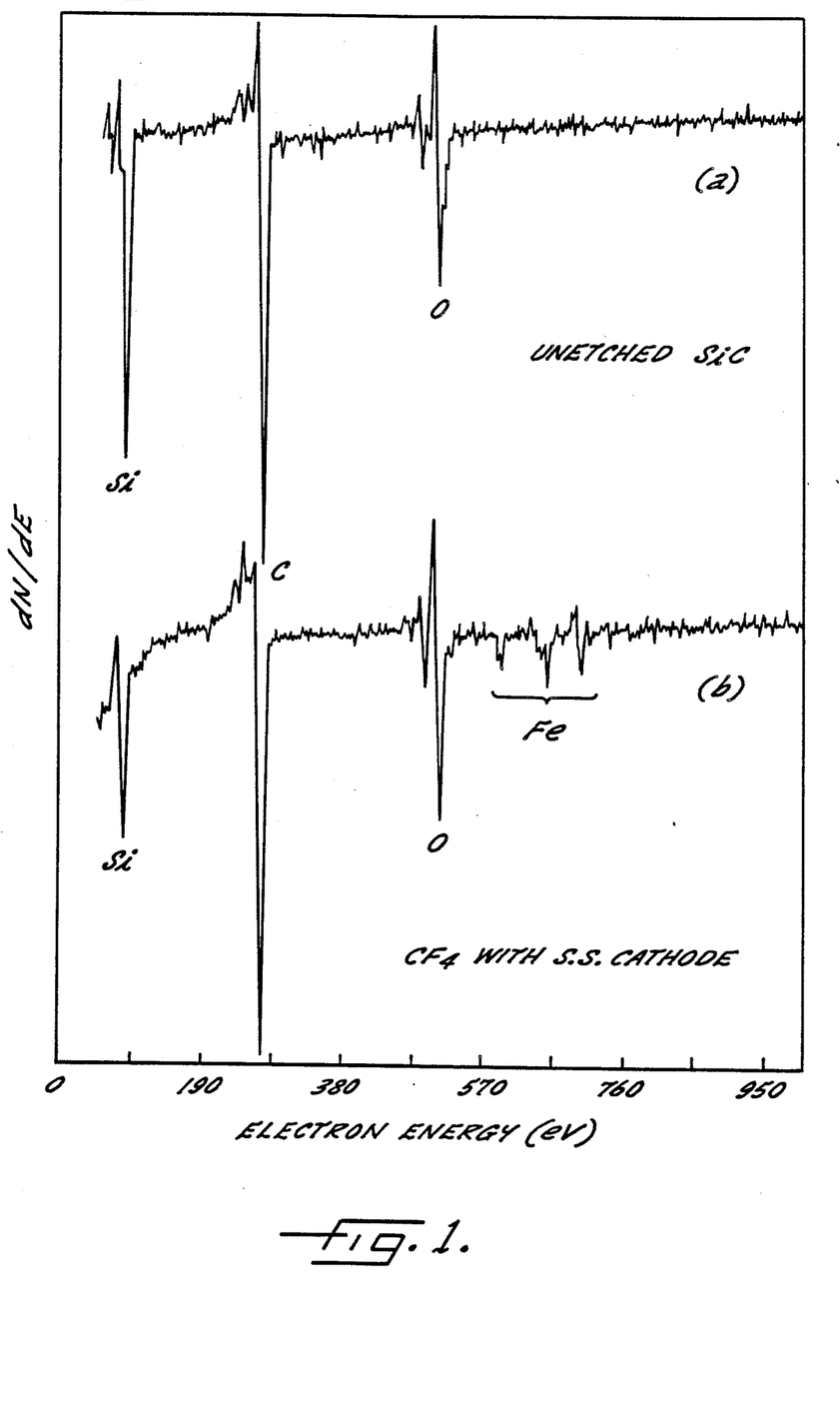
FIG. 1 shows two Auger electron spectra obtained for an unetched silicon carbide surface and a silicon carbide surface after reactive ion etching in carbon tetrafluoride using a stainless steel cathode.

Auger electron spectroscopy was used to analyze both the starting materials and the etched surfaces FIG. 1(a) shows a typical AES spectrum for unetched beta silicon carbide, and indicates the presence of silicon, carbon, and oxygen, present as a native oxide.

Figure 4:
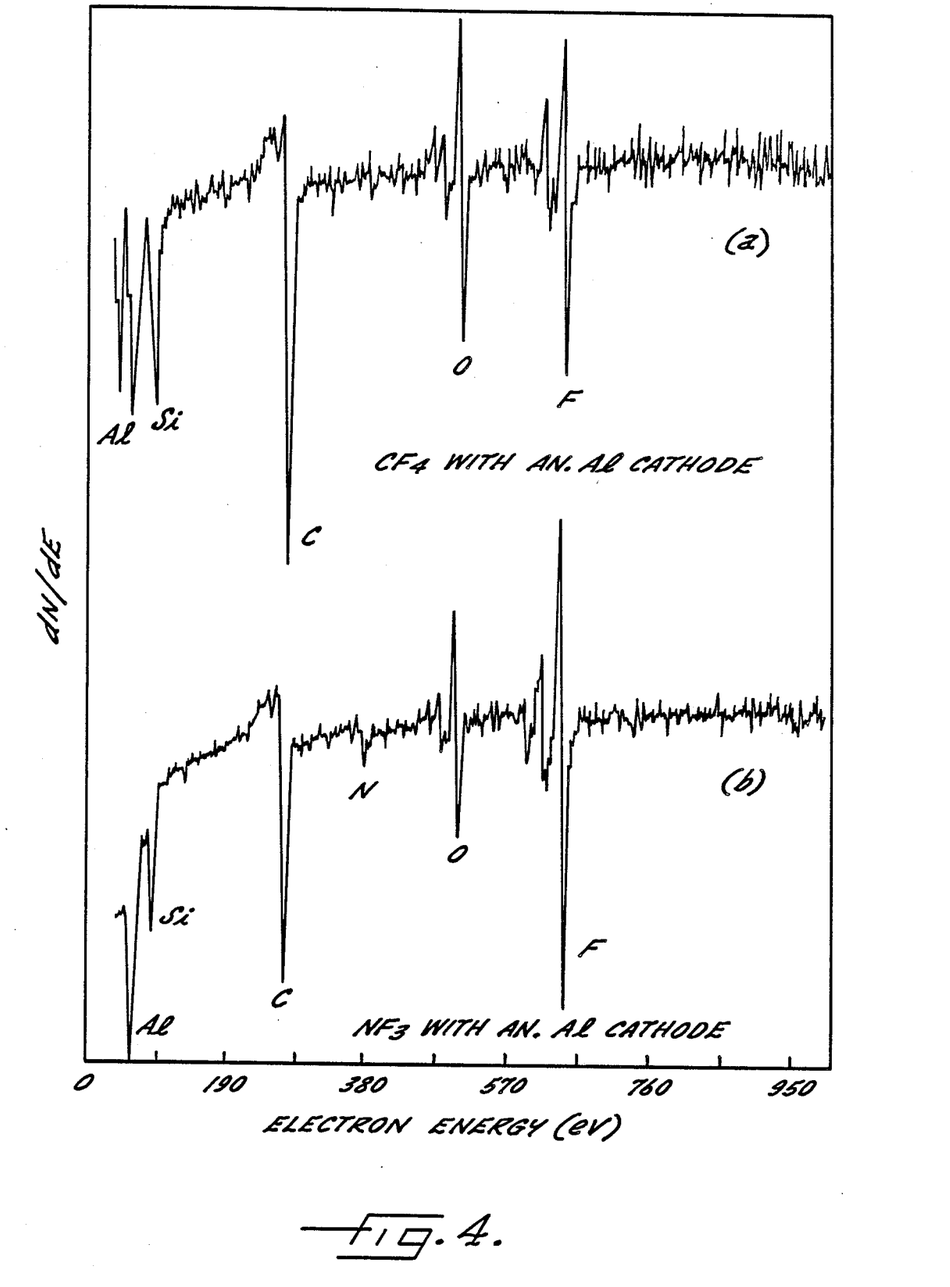
FIG. 4 illustrates two Auger electron spectra of an etched surface of silicon carbide following (a) reactive ion etching in carbon tetrafluoride, and (b) reactive ion etching in $NF_3$, both using an anodized aluminum cathode.

As stated earlier, a polymerization problem is commonly associated with halogenated hydrocarbons such as CF$_4$ are used as the etchant. This is illustrated by the AES spectra of FIGS. 4(a) and 4(b) which show a significant presence of fluorine (F) on the etched surfaces. It has been discovered according to the present invention, however, that fluorine is the chief reactant for both silicon and carbon. This reaction scheme makes NF$_3$ a desirable gas for etching SiC because it is more efficiently broken into free F radicals than are fluorinated hydrocarbons, and secondly because all of the possible by-products of its ionization are volatile. The practical advantages of these theoretical advantages were observed in the present invention in which etch rates were observed as fast as 211 nanometers per minute (nm/min), which are the highest etch rats ever reported for the dry etching of silicon carbide using any technique.

Figure 2:
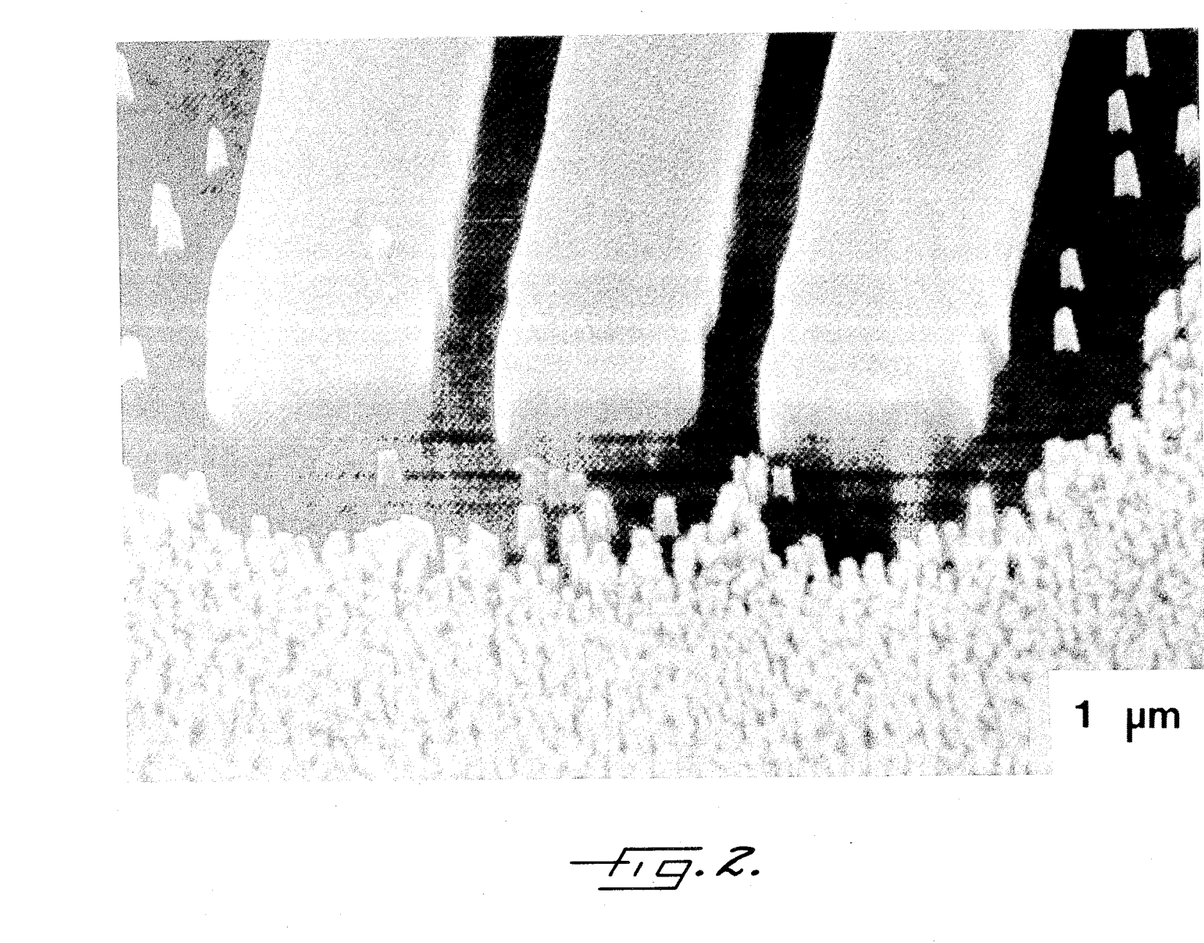
FIG. 2 is an electron micrograph of a silicon carbide surface after reactive ion etching in carbon tetrafluoride using a stainless steel cathode.
Figure 3:
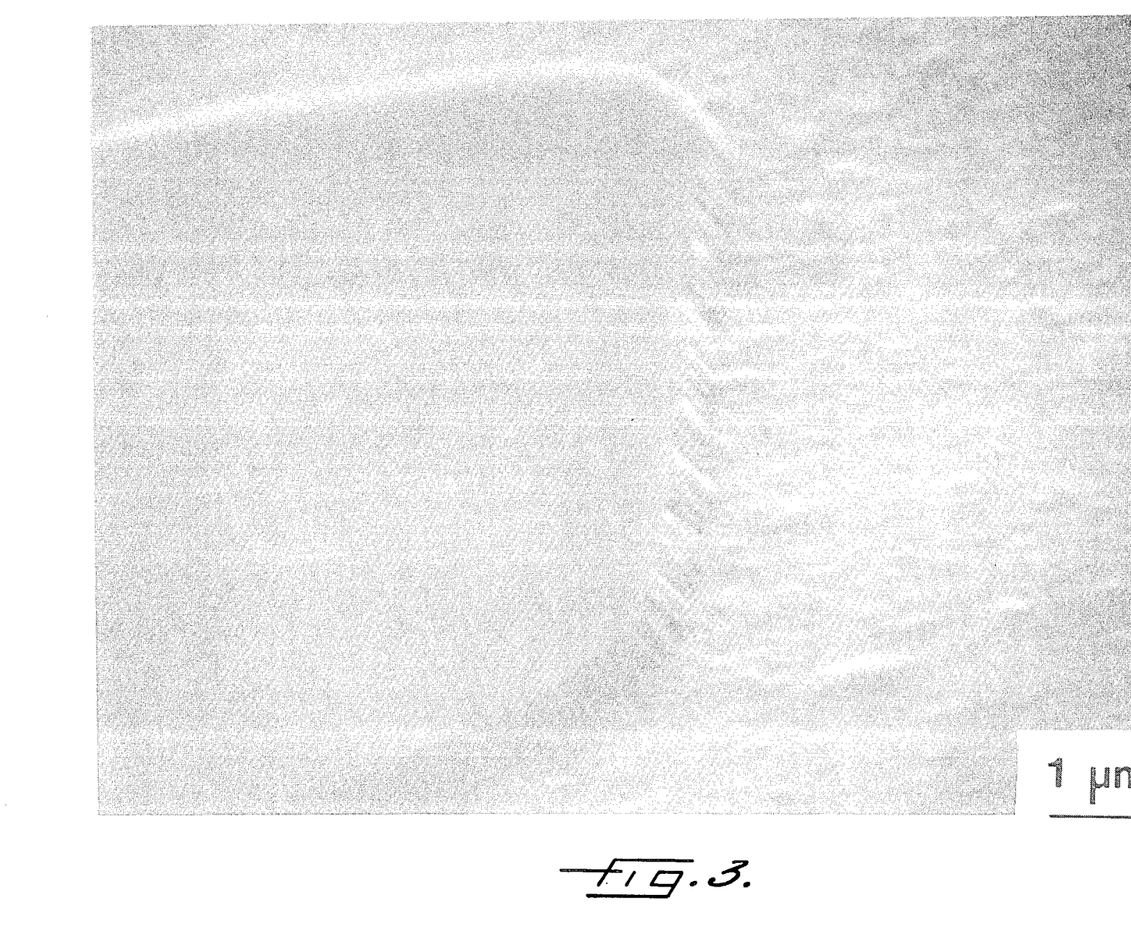
FIG. 3 is an electron micrograph of an etched surface of silicon carbide following a reactive ion etching in carbon tetrafluoride using anodized aluminum cathode.
Figure 5:
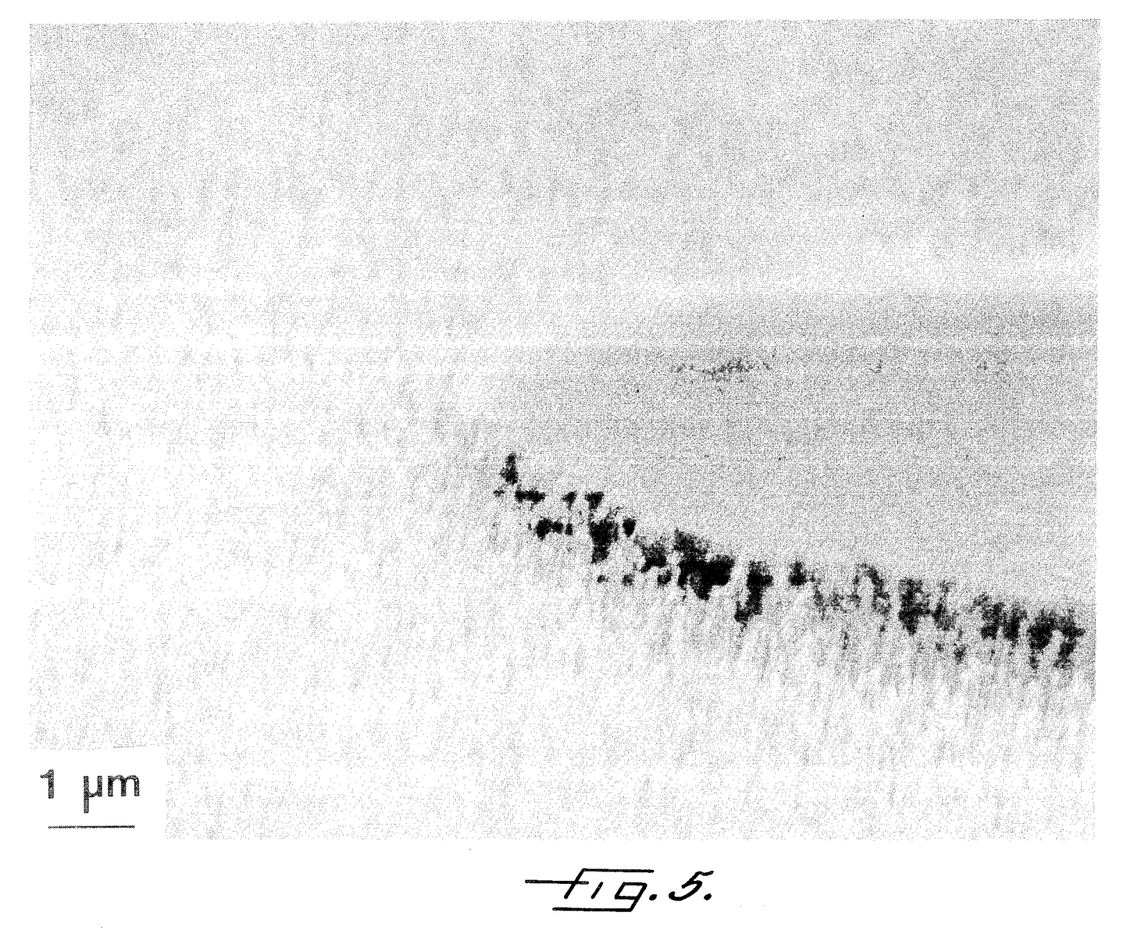
FIG. 5 is an electron micrograph of an etched surface of silicon carbide after reactive ion etching in $NF_3$ using an anodized aluminum cathode.

In the particular embodiment represented by FIGS. 3, 4 and 5, the reactive ion etching was carried out using an anodized aluminum cathode to support the SiC target. Under these conditions, however there existed an apparent presence of some aluminum oxide (Al$_2$O$_3$) on the etched surface, as demonstrated by the Auger electron spectrum of FIG. 4(b). Additionally, the somewhat rough surface shown in the micrograph of FIG. 5 was observed following the NF$_3$ etching using the anodized aluminum cathode. Although applicant does not wish to be bound by any particular theory, it is believed that this results from Al$_2$O$_3$ which has sputtered from the cathode and masked small portions of the surface, a process referred to as "micromasking." The presence of iron (Fe) in the AES spectrum of FIG. 1(b) and the rough surface seen in the micrograph of FIG. 2 demonstrate the occurrence of this same effect when a stainless steel cathode was used to support the target.

The presence of fluorine on the etched surface is also demonstrated by the AES spectrum in FIG. 4(b). Presently, it is believed that the lack of reactivity between the anodized aluminum cathode and the fluorine species allows the fluorine species to undesirably accumulate and polymerize on the etched surface.

Therefore, in order to eliminate the surface deposition of both fluorine and Al$_2$O$_3$, in a preferred embodiment of the invention a carbon cathode cover plate was placed in the RIE chamber. Carbon has several advantages in the method of the present invention: it has a very low sputter yield, and it is reactive with fluorine. As is known to those familiar with these technologies, sputtering occurs when an ion strikes a surface knocking an atom, molecule or ion loose from that surface as a result of the energy imparted by the impinging ion. This sputtered particle can be ejected from the cathode and deposit on the surface being etched, leading to the undesired impurity or micromasking referred to earlier herein. Of course, under certain circumstances, sputtering is a desired technique for depositing a particular material upon another material.

Figure 6:
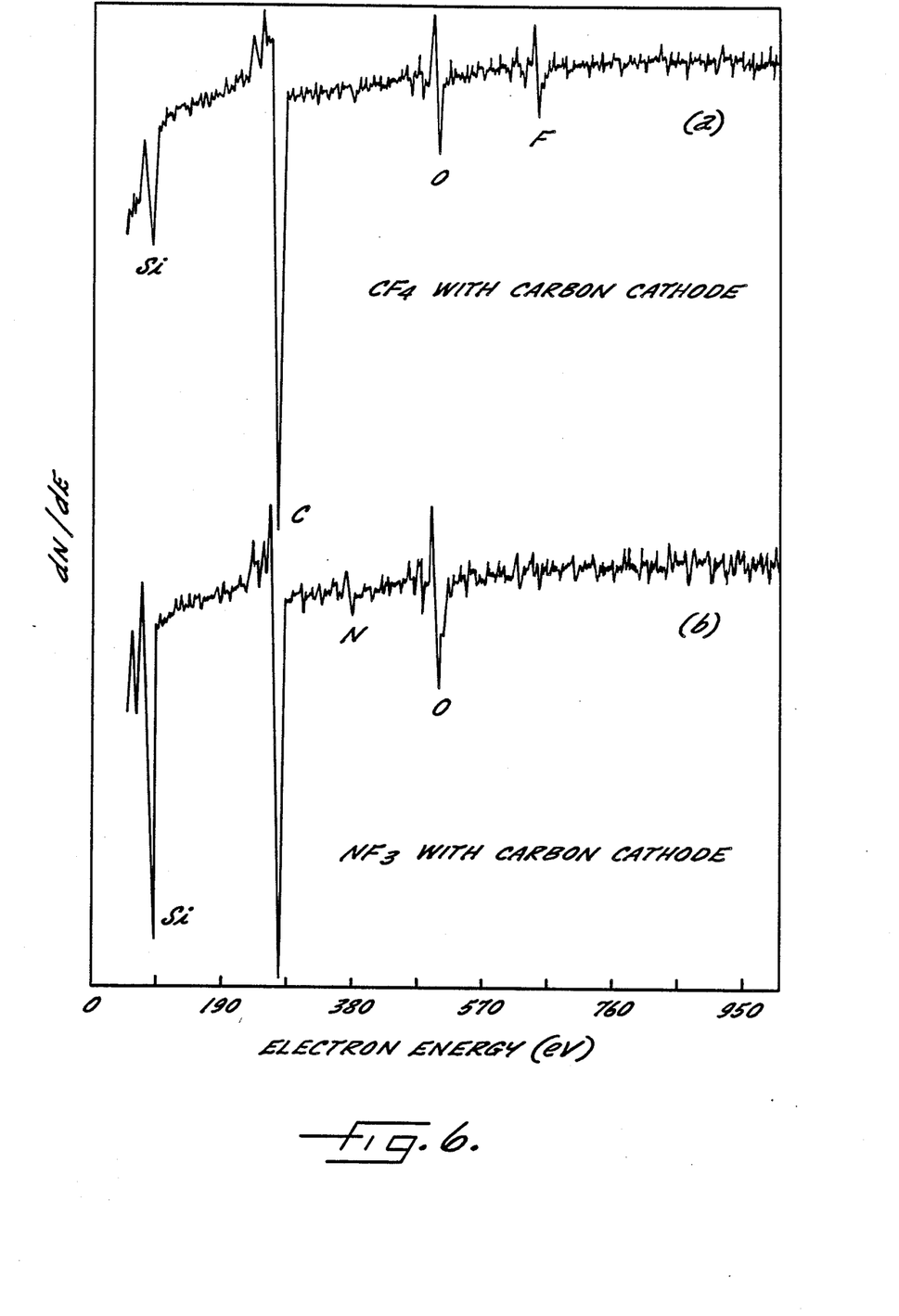
FIG. 6 illustrates two Auger electron spectra for a sample of silicon carbide etched with (a) $CF_4$, and (b) $NF_3$, both using a carbon cathode.

When the carbon cathode cover plate was used for the reactive ion etching of silicon carbide in pure $NF_3$, the greatly improved AES spectrum shown in FIG. 6(b) resulted. This indicates that the surface is very clean, with no fluorine peak visible and only a minor amount of nitrogen present after etching. As stated above, the carbon in the cathode reacts with the fluorine, keeping the fluorine from accumulating and polymerizing upon the etched silicon carbide surface.

Figure 7:
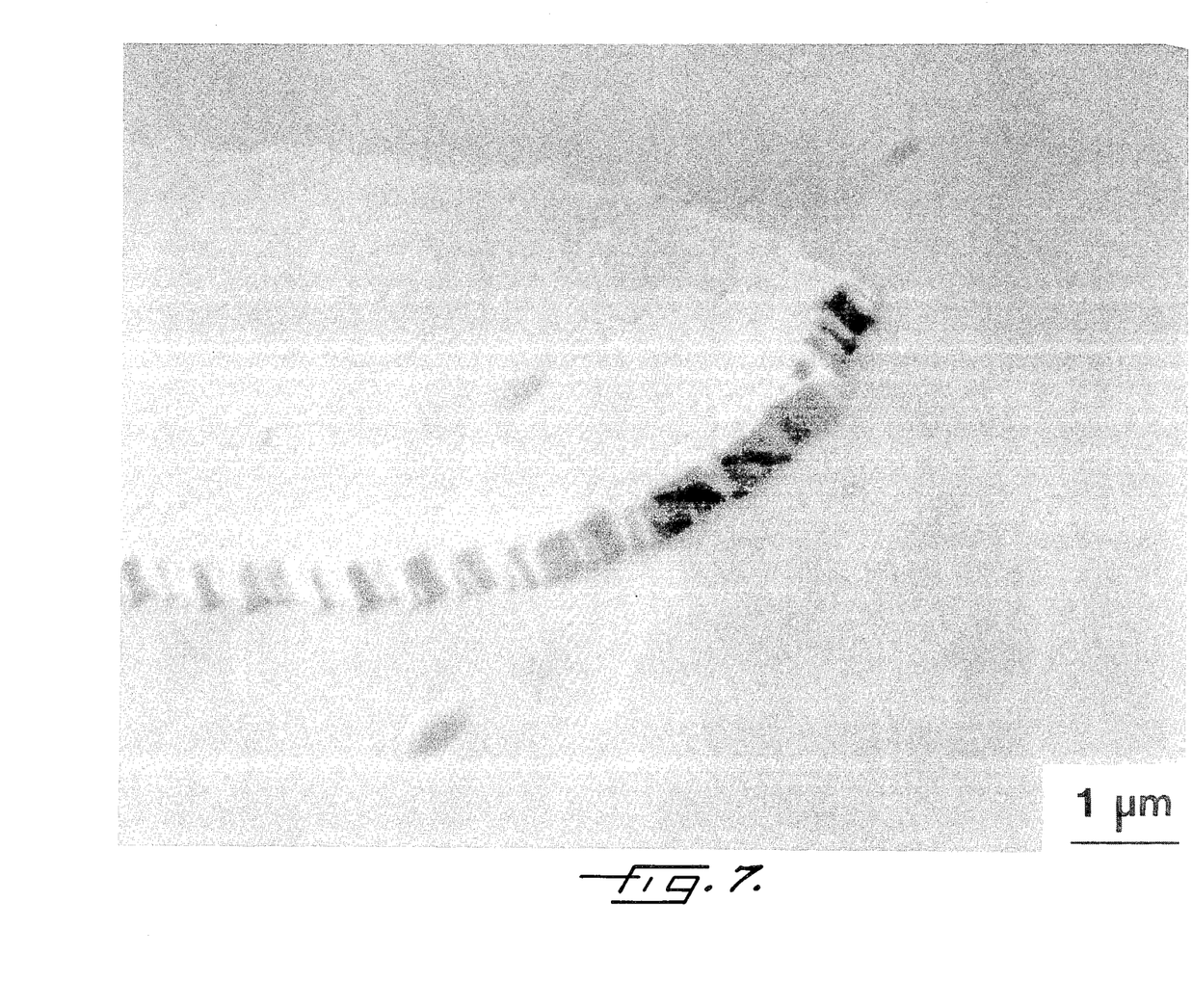
FIG. 7 is an electron micrograph of an etched surface of silicon carbide following reactive ion etching in carbon tetrafluoride, using a carbon cathode.
Figure 8:
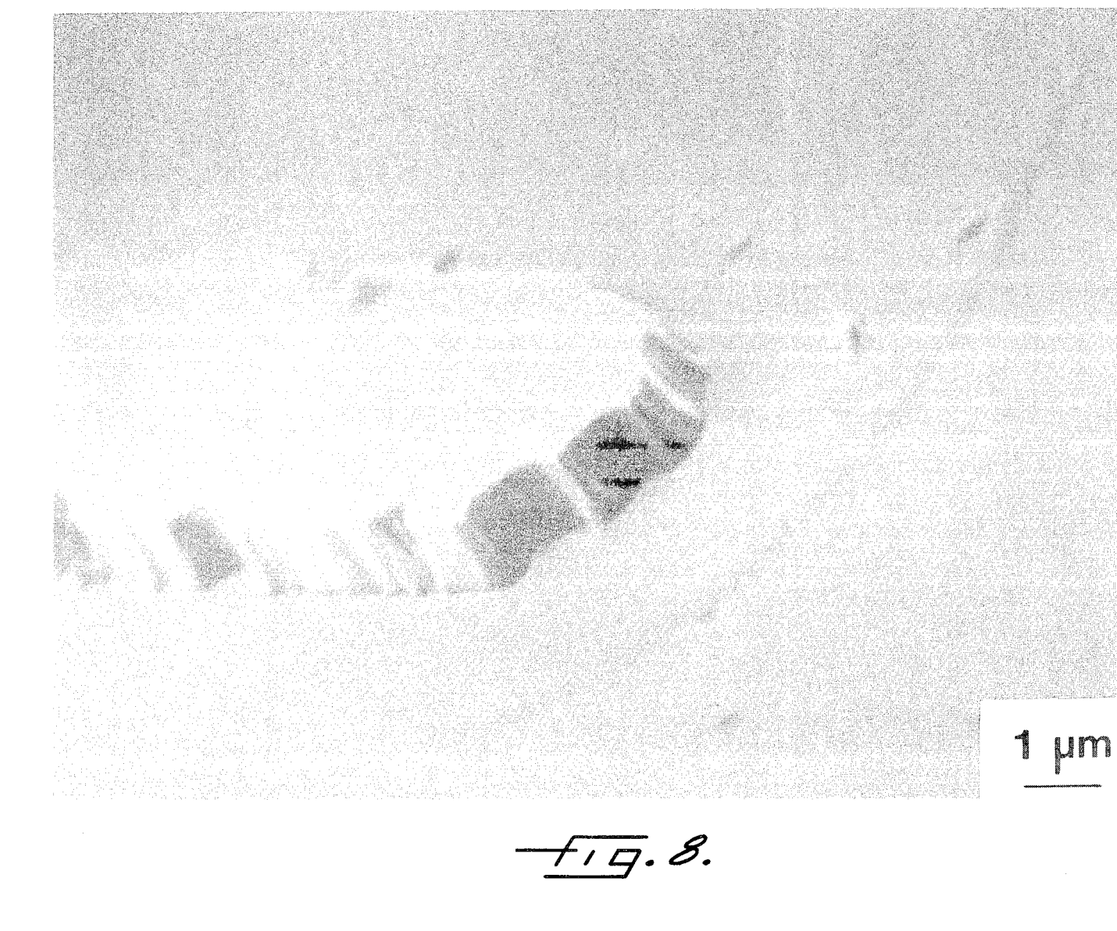
FIG. 8 is an electron micrograph of an etched surface of silicon carbide following reactive ion etching in $NF_3$ using a carbon cathode.
Figure 9:
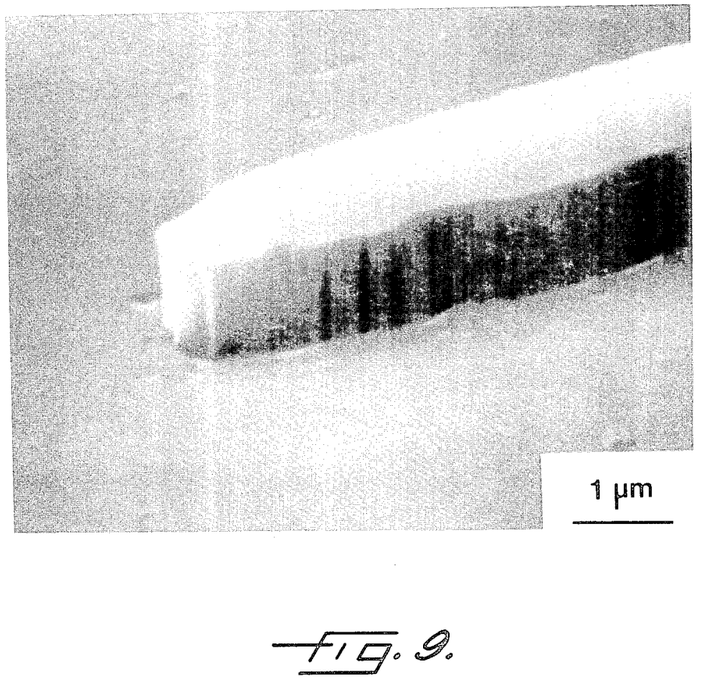
FIG. 9 is another electron micrograph of an etched surface of silicon carbide following reactive ion etching in $NF_3$ using a carbon cathode.

The differences between the use of the carbon cathode cover and the anodized aluminum cathode are demonstrated by FIG. 5 (anodized aluminum cathode) and FIGS. 7, 8 and 9 which shows the smooth etched surface of silicon carbide after reactive ion etching in $CF_4$ (FIG. 7) and in nitrogen trifluoride (FIGS. 8 and 9) using the carbon cathode.

Additionally, in spite of the use of carbon cathode in this embodiment, FIG. 6(b) shows no significant increase in the carbon signal of the AES spectrum.

In another embodiment of the invention, it has been found beneficial to use a quartz ($SiO_2$) coverplate for the cathode, particularly for relatively deeper etches; i.e. those greater than 3 microns. When the carbon cathode is used for such deeper etches, the etched surface may exhibit a "blackened" appearance resulting from surface roughness. Although the applicant does not wish to be bound by any particular theory, it is postulated that during the longer time periods required for such deeper etches, some of the free fluorine present may have the opportunity to react with carbon on the cathode coverplate. This in turn may result in a certain amount of polymeric fluorocarbon sputtering off of the coverplate and micromasking the $SiC_x$ surface.

By using a quartz coverplate, the only etch products that can form are $SiF_x$ (where x is 1 to 4), SiO and $O_2$. All of these species are volatile in the plasma, do not build up in the chamber, and do not form micromasking species. Also, the quartz coverplate shares certain advantages of the carbon (graphite) coverplate such as low sputter yield and harmless deposition on SiC. Indeed, if $SiO_2$ is sputtered onto the SiC surface, it will be removed by the etch even faster than the SiC.

This embodiment thus provides a method of etching high quality mesas to a depth greater than 10 microns, a dimension that is advantageous for forming high voltage p-n junction diodes from SiC. Under other circumstances, the carbon cathode coverplate remains advantageous, for example where the DC bias is desirably measured during etching (quartz is an insulator and complicates this measurement), or where cooling is preferably more efficient (quartz is a poorer thermal conductor than graphite).

The invention thus demonstrates that in the reactive ion etching of silicon carbide, the choice of cathode material plays a major role in the chemical and physical characteristics of the etched surface. Because high quality ohmic contacts require both a smooth and a chemically clean surface, the invention provides an optimal configuration for dry etching of silicon carbide by using nitrogen trifluoride and a carbon cathode. Given these characteristics, the invention comprises a method of patterning silicon carbide in the formation of electronic devices. By forming an appropriate masked pattern on the silicon carbide, etching it according to the present invention, and then removing the masks, desired patterns and devices can be fabricated.

In the specification, there have been set forth preferred and exemplary embodiments, which have been included by way of example and not limitation, the scope of the invention being set forth in the following claims.

That which I claim is:

1. A method of etching a silicon carbide target, the method comprising:

applying a plasma generating potential across two electrodes;

generating a plasma between the two electrodes by introducing a gas between the electrodes, and wherein the gas is easily dissociated substantially into its elemental species in the plasma and wherein substantially all of the dissociated species from the gas are volatile in the plasma and wherein at least one of the dissociated species is reactive with silicon carbide; and positioning a silicon carbide target to be etched on one of the electrodes, and wherein the electrode is formed from a material with a low sputter yield and wherein the electrode material is reactive with the dissociated species; and reacting the plasma with the silicon carbide to thereby etch the silicon carbide and while applying a magnetic field to the target to enhance the etch rate of the silicon carbide target in the plasma, while the reaction of the dissociated species with the electrode, and the electrode's low sputter yield prevents contamination of the target with either sputtered materials from the supporting electrode or unreacted dissociated species from the plasma.

2. A method according to claim 1 wherein the step of generating a plasma comprises forming a reactive ion plasma from nitrogen trifluoride.

3. A method according to claim 2 wherein the step of generating a reactive ion plasma comprises applying a direct current bias to the plasma.

4. A method according to claim 1 wherein the step of introducing a gas comprises introducing a mixture of about five percent nitrous oxide in nitrogen trifluoride at a pressure of about 100 milliTorr.

5. A method according to claim 1 wherein the step of applying a magnetic field comprises placing a magnet adjacent the silicon carbide target.

6. A method according to claim 1 wherein the step of positioning a silicon carbide target on one of the electrodes comprises positioning the silicon carbide target on the cathode.

7. A method according to claim 6 wherein the step of positioning the silicon carbide target on the cathode comprises positioning the silicon carbide target on a carbon cathode.

8. A method according to claim 6 wherein the step of positioning the silicon carbide target on the cathode comprises positioning the silicon carbide target on a quartz cathode.

9. A method according to claim 1 wherein the step of positioning a silicon carbide target comprises positioning a silicon carbide thin film.

10. A method according to claim 9 wherein the step of positioning a silicon carbide thin film comprises positioning a thin film of beta silicon carbide.

11. A method according to claim 9 wherein the step of positioning a silicon carbide thin film comprises positioning a thin film of alpha silicon carbide.

12. A method according to claim 1 wherein the step of applying a plasma generating potential comprises applying between about 10 and about 400 watts of power to the electrodes.

13. A method according to claim 1 wherein the step of applying a plasma generating potential comprises applying a power density of between about 0.04 and about 2 watts per square centimeter to the powered electrode.

14. A method according to claim 1 wherein the step of applying a plasma generating potential comprises applying a power density of between about 0.4 and 0.9 watts per square centimeter to the powered electrode.

15. A method according to claim 1 wherein the step of introducing a gas between the electrodes comprises introducing the gas at a pressure of between about 5 milliTorr and about 10 Torr.

16. A method according to claim 1 wherein the step of introducing a gas between the electrodes comprises introducing the gas at a pressure of between bout 40 and 200 milliTorr.

17. A method according to claim 1 wherein the step of introducing a gas comprises introducing a gas at a flow rate of between about 1 and about 500 standard cubic centimeters per minute.

18. A method according to claim 1 wherein the step of introducing a gas comprises introducing a gas at a flow rate of between about 20 and about 60 standard cubic centimeters per minute.

19. A method according to claim 1 wherein the step of introducing a gas comprises introducing a gas at a flow rate of about 25 standard cubic centimeters per minute.

20. A method according to claim 1 wherein the step of introducing a gas comprises introducing a mixture of nitrogen trifluoride and oxygen.

21. A method according to claim 1 wherein the step of introducing a gas comprises introducing a mixture of nitrogen trifluoride and argon.

22. A method according to claim 1 wherein the step of introducing a gas comprises introducing a mixture of nitrogen trifluoride, oxygen and argon.

23. A method of etching a silicon carbide target, the method comprising:
applying a plasma generating potential across an anode and a quartz cathode;
generating a plasma between the anode and cathode by introducing a gas between the anode and cathode, and wherein the gas is easily dissociated substantially into its elemental species in the plasma and wherein substantially all of the dissociated species from the gas are volatile in the plasma and wherein at least one of the dissociated species is reactive with silicon carbide; and
positioning a silicon carbide target to be etched on the quartz cathode; and
reacting the plasma with the silicon carbide to thereby etch the silicon carbide.

24. A method of etching of a silicon carbide target comprising:
applying a plasma generating potential across an anode and a quartz cathode;
generating a plasma between the anode and the quartz cathode by introducing nitrogen trifluoride therebetween;
positioning a silicon carbide target to be etched on the quartz cathode whereby the quartz cathode exhibits a low sputter yield and is reactive with dissociated fluorine from the nitrogen trifluoride; and
reacting the plasma with the silicon carbide to thereby etch the silicon carbide with the reaction of dissociating fluorine with the quartz cathode, and the cathode's low sputter yield prevents contamination of the target with either sputtered materials from the cathode or polymerized fluorine species from the plasma.

25. A method according to claim 24 wherein the step of positioning a silicon carbide target comprises positioning a doped silicon carbide target.

26. A method according to claim 25 wherein the step of positioning a doped silicon carbide target comprises positioning a doped beta silicon carbide target.

27. A method according to claim 25 wherein the step of positioning a doped silicon carbide target comprises positioning a doped alpha silicon carbide target.

28. A method according to claim 24 wherein the step of generating a plasma further comprises applying a direct current bias to the plasma.

29. A method of reactive ion beam etching of a silicon carbide target comprising:
applying a plasma generating potential and a direct current bias across two electrodes positioned in a source chamber;
generating a reactive ion plasma between the two electrodes in the source chamber by introducing a gas which is easily dissociated into its elemental species in the plasma and wherein substantially all of the dissociated species are volatile in the plasma and wherein at least one of the species is reactive with silicon carbide;
positioning a silicon carbide target in a target chamber on a quartz support to thereby prevent contamination of the target with either sputtered materials from the quartz support or polymerized species from the plasma, and wherein the target chamber is in communication with the source chamber; and
applying a negative bias to the target so that a reactive ion plasma beam is directed from the source chamber to the target chamber to thereby etch the silicon carbide target.

30. A method according to claim 29 wherein the step of introducing a gas comprises introducing nitrogen trifluoride.

31. A method according to claim 29 further comprising maintaining the target chamber at a lesser pressure than the source chamber.

32. A method of patterning silicon carbide in the formation of electronic devices using reactive ion etching, the method comprising:
forming a masked pattern on a silicon carbide substrate;
positioning the masked silicon carbide substrate as a target on a quartz cathode in a reactive ion plasma system having an anode opposite the quartz cathode; and
applying a plasma generating potential and a direct current bias across the anode and quartz cathode in the reactive ion system;
generating plasma in the system by introducing a gas which is easily dissociated in the plasma and wherein substantially all of the dissociated species are volatile in the plasma and wherein at least one of the dissociated species is reactive with silicon carbide;

wherein the quartz cathode reacts with the dissociated species in the plasma to thereby prevent contamination of the target with either sputtered materials from the quartz cathode or polymerized species from the plasma; and reacting the plasma with the silicon carbide substrate to thereby etch the silicon carbide.

33. A method according to claim 32 further comprising the step of removing the mask from the silicon carbide substrate following the step of reacting the plasma with the silicon carbide.

34. A method according to claim 32 wherein the step of introducing a gas comprises introducing nitrogen trifluoride.

* * * * *

UNITED STATES PATENT AND TRADEMARK OFFICE
CERTIFICATE OF CORRECTION

PATENT NO. : 4,981,551
DATED : January 1, 1991
INVENTOR(S) : John W. Palmour

It is certified that error appears in the above-indentified patent and that said Letters Patent is hereby corrected as shown below:

On the title page, Under "Other Publication" Item [56]
"Carbides" should be --Carbide--

Col 6. line 12, insert a period (".") between the words "surfaces" and "FIG.".

Col 7. line 38, "$SIC_x$" should be --SIC--
line 40, "SIF" should be --$SIF_x$--

Signed and Sealed this

Twelfth Day of October, 1993

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 4,981,551
DATED : January 1, 1991
INVENTOR(S) : John W. Palmour

It is certified that error appears in the above-identified patent and that said Letters Patent is hereby corrected as shown below:

Column 1,
Line 1, please add -- This invention was made with goverment support under contract no. N00014-82-K-0182 awarded by the office of Naval Research. The government has certain rights in the invention --.

Signed and Sealed this

Twenty-fifth Day of October, 2005

JON W. DUDAS
*Director of the United States Patent and Trademark Office*